(12) United States Patent
Vaupel et al.

(10) Patent No.: US 9,448,130 B2
(45) Date of Patent: Sep. 20, 2016

(54) SENSOR ARRANGEMENT

(71) Applicant: Infineon Technologies AG, Neubiberg (DE)

(72) Inventors: Mathias Vaupel, Regensburg (DE); Horst Theuss, Wenzenbach (DE); Thomas Lehmann, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 145 days.

(21) Appl. No.: 14/016,046

(22) Filed: Aug. 31, 2013

(65) Prior Publication Data
US 2015/0059454 A1 Mar. 5, 2015

(51) Int. Cl.
| | |
|---|---|
| *G01L 9/16* | (2006.01) |
| *G01M 1/12* | (2006.01) |
| *H01L 23/00* | (2006.01) |
| *G01L 19/00* | (2006.01) |
| *G01L 19/14* | (2006.01) |

(52) U.S. Cl.
CPC ............. *G01M 1/122* (2013.01); *H01L 23/00* (2013.01); *G01L 19/0084* (2013.01); *G01L 19/0092* (2013.01); *G01L 19/141* (2013.01); *G01L 19/143* (2013.01); *H01L 2224/48091* (2013.01); *H01L 2224/48247* (2013.01); *H01L 2224/48257* (2013.01); *H01L 2224/49171* (2013.01); *H01L 2924/1815* (2013.01); *Y10T 29/49117* (2015.01)

(58) Field of Classification Search
CPC .......... H01L 2224/48247; H01L 2224/48227; H01L 2224/48137; H01L 2224/48141; G01F 15/14; G01N 27/223; Y10T 29/49007; Y10T 29/49171; G01L 19/141; G01L 19/0084; G01L 19/0092; G01L 19/143

USPC .................... 73/204.26, 204.22, 754, 31.06; 257/787, 433; 29/592.1, 595
See application file for complete search history.

(56) References Cited

U.S. PATENT DOCUMENTS

| | | | | |
|---|---|---|---|---|
| 5,948,991 | A * | 9/1999 | Nomura et al. ................. | 73/727 |
| 6,313,514 | B1 * | 11/2001 | Winterer ................. | B81B 7/007 |
| | | | | 257/417 |
| 6,393,907 | B1 * | 5/2002 | Yamakawa et al. ....... | 73/204.26 |
| 6,516,785 | B1 * | 2/2003 | Nakada et al. ............... | 123/494 |
| 6,789,418 | B2 * | 9/2004 | Uramachi et al. ......... | 73/204.22 |
| 6,962,282 | B2 * | 11/2005 | Manansala ........... | G06K 9/0002 |
| | | | | 228/180.5 |
| 7,219,543 | B2 * | 5/2007 | Tanaka et al. ............. | 73/204.22 |
| 7,219,544 | B2 * | 5/2007 | Tanaka et al. ............. | 73/204.26 |

(Continued)

FOREIGN PATENT DOCUMENTS

| | | |
|---|---|---|
| DE | 102005038443 A1 | 2/2007 |
| DE | 102005054177 A1 | 5/2007 |

(Continued)

*Primary Examiner* — Lisa Caputo
*Assistant Examiner* — Jonathan Dunlap

(57) ABSTRACT

A sensor arrangement for sensing an environmental property of an environment of the sensor arrangement, the sensor arrangement comprising:
- a carrier;
- an active sensor component arranged at the carrier and configured for providing a sensor signal being indicative of the environmental property;
- a molding structure encapsulating at least a part of an exterior surface of the carrier and comprising an access recess exposing the active sensor component with regard to the environment;
- wherein the access recess is arranged asymmetrically with regard to the carrier.

19 Claims, 7 Drawing Sheets

(56) References Cited

U.S. PATENT DOCUMENTS

| | | | | |
|---|---|---|---|---|
| 7,404,321 | B2* | 7/2008 | Tanaka et al. | 73/204.26 |
| 7,644,615 | B2* | 1/2010 | Arisaka | 73/335.04 |
| 7,703,339 | B2* | 4/2010 | Sulouff et al. | 73/861.85 |
| 7,939,901 | B2* | 5/2011 | Minamio | B29C 45/14418 257/433 |
| 7,994,618 | B2* | 8/2011 | Dehe et al. | 257/684 |
| 8,156,815 | B2* | 4/2012 | Hunziker | G01D 11/245 73/706 |
| 8,776,597 | B2* | 7/2014 | Waga et al. | 73/335.04 |
| 2006/0001116 | A1* | 1/2006 | Auburger et al. | 257/433 |
| 2006/0075815 | A1* | 4/2006 | Tanaka et al. | 73/204.26 |
| 2006/0079018 | A1* | 4/2006 | Hurt | G02B 6/4206 438/64 |
| 2006/0278027 | A1* | 12/2006 | Shirasaka et al. | 73/866.5 |
| 2007/0113648 | A1* | 5/2007 | Arisaka | 73/335.04 |
| 2007/0126130 | A1* | 6/2007 | Dehe et al. | 257/787 |
| 2007/0277623 | A1* | 12/2007 | McDonald et al. | 73/861.63 |
| 2009/0072333 | A1* | 3/2009 | Haag et al. | 257/415 |
| 2010/0043530 | A1* | 2/2010 | Elian et al. | 73/31.06 |
| 2010/0107769 | A1* | 5/2010 | Ochs | B81B 7/0058 73/708 |
| 2010/0212433 | A1* | 8/2010 | Hunziker | G01D 11/245 73/706 |
| 2011/0000313 | A1* | 1/2011 | Eckhardt et al. | 73/861.61 |
| 2012/0000285 | A1* | 1/2012 | Waga et al. | 73/335.04 |

FOREIGN PATENT DOCUMENTS

| | | |
|---|---|---|
| DE | 102009038706 A1 | 3/2010 |
| EP | 1645897 A1 | 4/2006 |

* cited by examiner

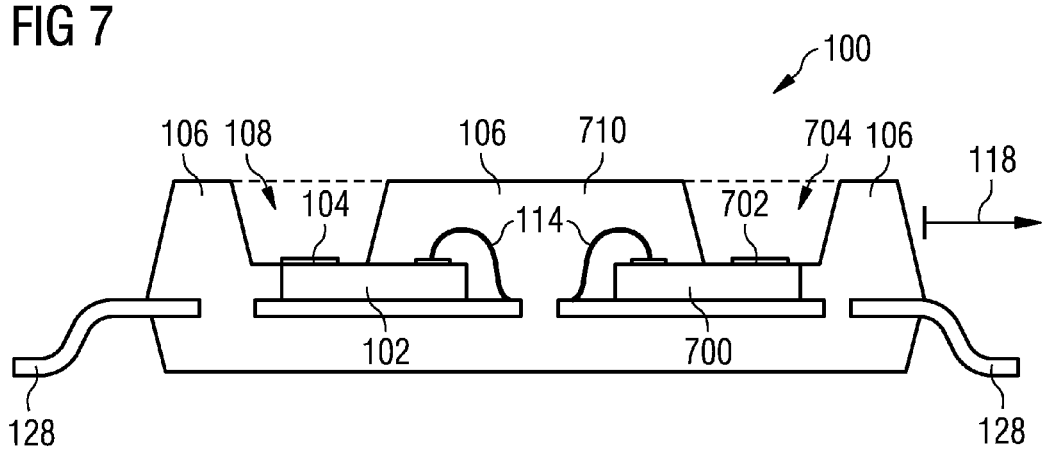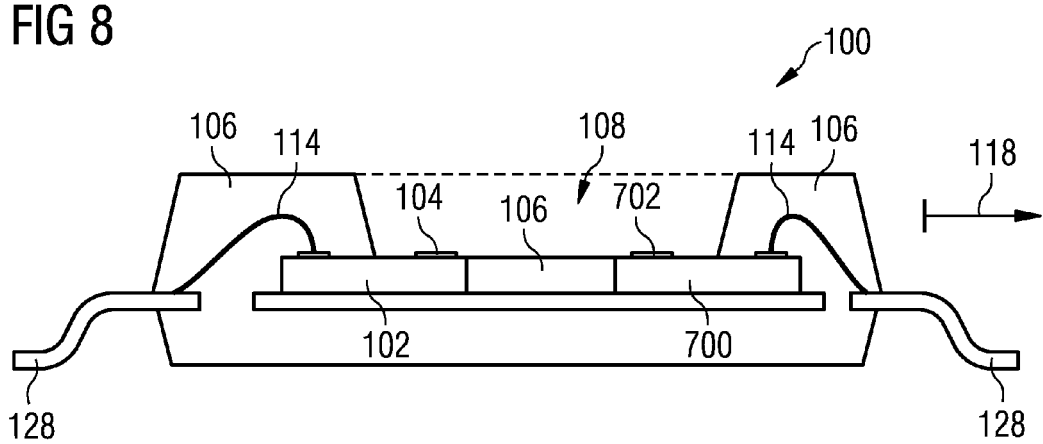

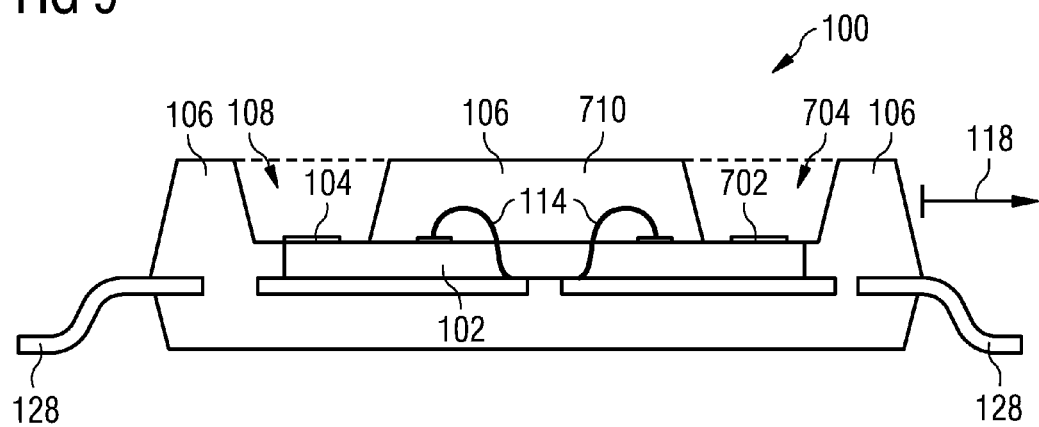
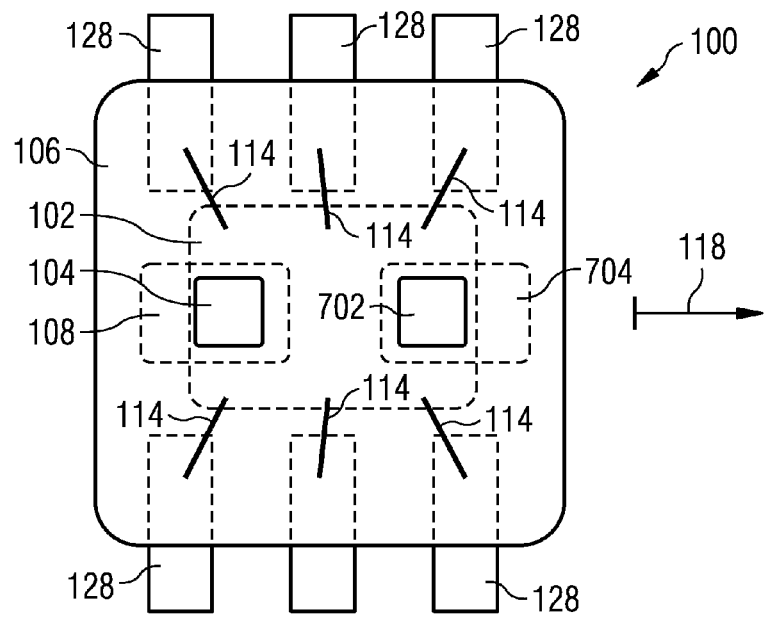

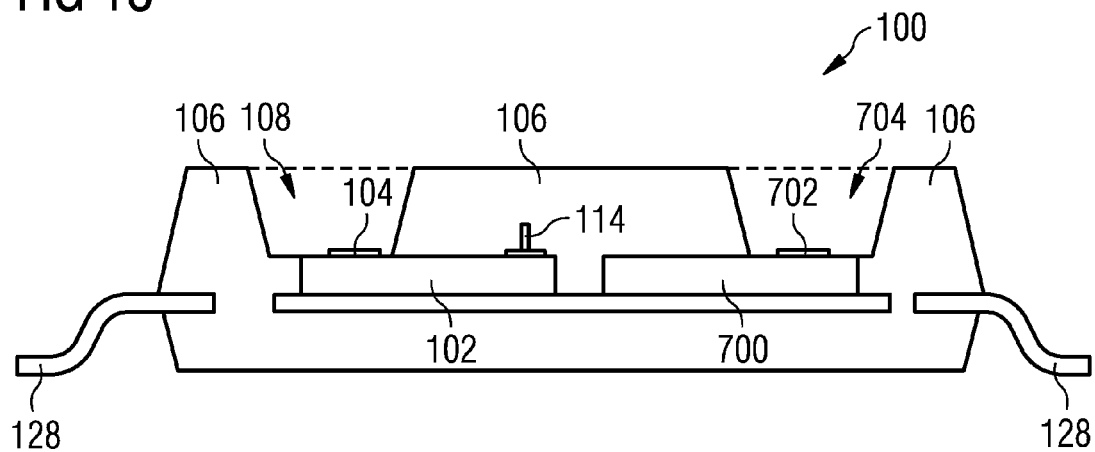
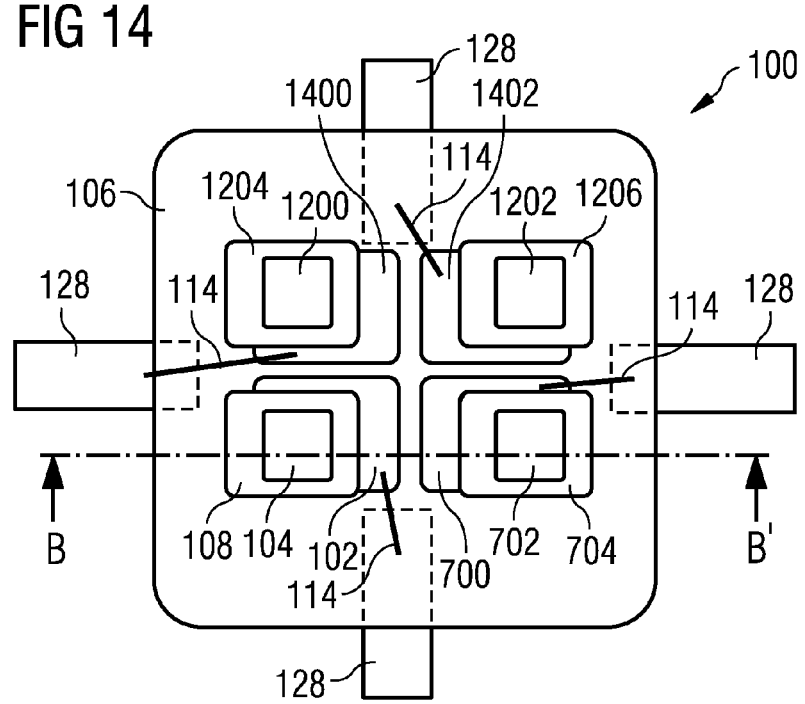

SENSOR ARRANGEMENT

BACKGROUND OF THE INVENTION

1. Field of the Invention

The present invention relates to a sensor arrangement for sensing an environmental property of an environment of the sensor arrangement. The invention also relates to a method of manufacturing a sensor arrangement for sensing an environmental property of an environment of the sensor arrangement.

2. Description of the Related Art

Conventional packages, such as mold structures, for partially encapsulating carriers (such as electronic chips) have evolved to a level where the package no longer significantly impedes the performance of the carriers. For instance, molded structures are used for packaging sensor arrangements (for pressure or gas sensors) comprising an active sensor component on a carrier, wherein the active sensor component is exposed to an environment to detect an environmental property.

However, there is still potentially room to simplify the packaging of carriers and active sensor components of a sensor arrangement while providing a freedom to further reduce the dimensions of such sensor arrangements without deteriorating the sensor performance.

SUMMARY OF THE INVENTION

There may be a need for a sensor arrangement with a simple processing architecture and with freedom of design in terms of miniaturization.

According to an exemplary embodiment, a sensor arrangement for sensing an environmental property of an environment of the sensor arrangement is provided, wherein the sensor arrangement comprises a carrier, an active sensor component arranged at the carrier and configured for providing a sensor signal being indicative of the environmental property, and a molding structure encapsulating at least a part of an exterior surface of the carrier and comprising an access recess exposing the active sensor component with regard to the environment, wherein the access recess is arranged asymmetrically with regard to the carrier.

According to another exemplary embodiment, a method of manufacturing a sensor arrangement for sensing an environmental property of an environment of the sensor arrangement is provided, wherein the method comprises arranging an active sensor component at a carrier, configuring the active sensor component for providing a sensor signal being indicative of the environmental property when the sensor arrangement is in operation, and forming a molding structure to encapsulate at least a part of an exterior surface of the carrier and to comprise an access recess exposing the active sensor component with regard to the environment so that the access recess is arranged asymmetrically with regard to the carrier.

An exemplary embodiment has the advantage that an asymmetric arrangement of the access recess with regard to the carrier allows to locate the active sensor component sufficiently far away from electric contacting structures of the carrier such as wire bonds. The opportunity to position an active sensor component of a sensor arrangement remotely from electric contacting structures is highly advantageous to achieve compliance with design rules and to avoid undesired interaction between active sensor component and electric contacting structures. Meeting such design rules becomes more and more difficult particularly when dimensions of sensor arrangements become smaller and smaller, and is achieved in a simple and efficient way according to exemplary embodiments.

DESCRIPTION OF FURTHER EXEMPLARY EMBODIMENTS

In the context of the present application, the term "environmental property" may particularly denote a physical, chemical or biological variable (for instance a parameter value of such a variable) present in the environment to be sensed by the sensor arrangement. Examples are a pressure value or a gas concentration, or the presence or absence of a certain chemical.

In the context of the present application, the term "carrier" may particularly denote any physical base structure which is configured for serving as a mounting base or support for an active sensor component (which may be separate from the carrier or may be integrally formed as part thereof). For instance, the carrier may be an electronic chip (such as a semiconductor chip), a printed circuit board (PCB), a ceramic plate, a flex board, or any other support structure which is appropriate for receiving or accommodating or forming an active sensor component to mechanically fasten (and optionally to electrically contact) the active sensor component. The term "electronic chip" may particularly denote any electronic member such as a semiconductor chip which has active and/or passive circuit components, particularly integrated circuit components.

In the context of the present application, the term "active sensor component" may particularly denote a physical structure which is capable of sensing or detecting an environmental property quantitatively (such as detecting a value of a parameter, for instance a pressure value) or qualitatively (such as detecting the presence or absence of an event to be sensed, for instance the presence or absence of a gas). Depending on the environmental property, such an active sensor component may change at least one physical property to thereby generate a sensor signal (in particular an electric signal) which is characteristic for the environmental property to be sensed.

In the context of the present application, the term "molding structure" may particularly denote a mold which can be supplied in a liquid or granulate form to be deposited over part of the carrier including its electric contact structures and which may be subsequently hardened or cured so that at least a part of the carrier surface and preferably the entire electric contact structure surface is covered by the mold material. The molding structure may then form at least part of an exterior surface of the resulting sensor arrangement. The mold material may be a plastic material, having, if desired or required, filler particles embedded therein for adjusting the material properties thereof (for instance for increasing the thermal conductivity). Such a molding not only mechanically fastens the various components to one another but also provides for a robust constitution of the carrier including its electric contact structures and can contribute also to the heat removal capability of the molding structure.

In the context of the present application, the term "access recess" may particularly denote a void volume delimited at least partially by the molding structure and/or the carrier and thereby ensure that the active sensor component is in direct interaction with the environment, so that the active sensor component is influenced in dependence of the actual environmental property.

In the context of the present application, the term "arranged asymmetrically" may particularly denote a relative arrangement of access recess (particularly a center thereof) with regard to the carrier (particularly a center thereof) so that no common point of symmetry and axis of symmetry exist which could map at the same time portions of the access recess to all remaining portions of the access recess and portions of the carrier to all other portions of the carrier. In particular, the access recess may be laterally displaced with regard to the carrier to achieve such an asymmetric arrangement. In this context, the lateral direction can be considered as a direction within a surface plane of a main surface or mounting surface of the carrier. Additionally or alternatively, an asymmetric arrangement of the access recess with regard to the carrier can also be achieved by configuring the access recess and/or the molding structure (delimiting the access recess) as an asymmetric structure as such. In other words, no common point of symmetry and axis of symmetry exists in such a scenario which could map portions of the access recess to all remaining portions of the access recess.

In the following, further exemplary embodiments of the sensor arrangement and the method will be explained.

In an embodiment, a center of gravity of the access recess is displaced with regard to a center of gravity of the carrier in a lateral direction. Additionally or alternatively, a center of gravity of the active sensor component is displaced with regard to a center of gravity of the carrier in this lateral direction. In an embodiment, the lateral direction may be perpendicular to a stacking direction along which the carrier and the active sensor component may be stacked. By such a lateral displacement between access recess and carrier (in many embodiments, the active sensor component is arranged at a central position of the access recess), the active sensor component may be moved away from a central position of a mounting surface of the carrier towards a lateral edge of the carrier. Thereby, it becomes possible to space the active sensor component sufficiently from bond pads (such as wire bonds) which may be arranged asymmetrically with regard to the carrier as well. In other words, the bond pads may be arranged to be concentrated in a portion of the carrier which is remote from a position of the active sensor component.

In an embodiment, the molding structure may be arranged asymmetrically with regard to at least one of the active sensor component and the carrier.

In an embodiment, a center of gravity of the access recess is in alignment with a center of gravity of the active sensor component in the lateral direction. The active sensor component may hence be arranged at a central position of the access recess (for instance spaced with regard to limits of the molding structure defining the access recess only by technical tolerances). This symmetry between active sensor component and access recess also contributes to the freedom to implement small carriers in the sensor arrangement without violating design rules. In a stacking direction of carrier and active sensor component the center of gravity of the access recess and of the active sensor component may be flushing.

In an embodiment, the sensor arrangement comprises at least one electric connection structure configured for electrically contacting the carrier and being arranged exclusively at a side (such as a lateral side) of the active sensor component which faces a center of gravity of the carrier, whereas another side (such as another lateral side) of the active sensor component which is averted with regard to the center of gravity of the carrier is free of electric connection structures. Such one or more electric connection structures may be wire bonds, electric contacts for a carrier (such as an electronic chip) mounted in accordance with a flip-chip assembly, etc. More generally, the described configuration allows to arrange electric connection structures for electrically contacting the carrier sufficiently remote from the active sensor components to prevent undesired interactions and/or to meet predefined design rules.

In particular, the sensor arrangement may comprise at least one wire bond (particularly a set of wire bonds) as electric connection structure(s) configured for electrically contacting the carrier and being arranged exclusively at a lateral side of the active sensor component which is averted (i.e. is located remote) with regard to a center of gravity of the access recess, whereas another lateral side of the active sensor component which faces (i.e. is located close to) the access recess is free of wire bonds. For instance, a set of wire bonds may be distributed around only a portion of the perimeter of the carrier, wherein the active sensor component may be displaced away from a center of a mounting surface of the carrier with regard to a remaining, other portion of the perimeter of the carrier. This allows to select the distance between active sensor component and wire bonds sufficiently large and in accordance with design rules of a certain technology while maintaining the possibility to implement small sized electronic chips as carrier.

In an embodiment, a set of wire bonds configured for electrically contacting the carrier are distributed asymmetrically around a circumference of the carrier. A center of gravity of the set of wire bonds may be shifted away from a center of the carrier antiparallel to a shift of the active sensor component away from a center of the carrier.

In an embodiment, the sensor arrangement comprises at least one electrically conductive pad extending partially inside and partially outside of the molding structure, wherein each of the at least one electrically conductive pad is electrically connected to an assigned one of the at least one wire bond. Such pads may electrically couple the sensor arrangement to an electronic periphery (for instance a board on which the sensor arrangement is to be mounted). Such a pad may be a sheet like a structure to which an assigned wire bond may be connected and which may allow for a mechanical and electrical connection of the sensor arrangement to a periphery, for instance to a printed circuit board (PCB).

In an embodiment, the at least one wire bond extends completely within the molding structure. Thus, the wire bonds may be protected mechanically by the overmolded molding structure.

In an embodiment, the molding structure comprises an annular section (such as an annular protrusion) which circumferentially surrounds the active sensor component and at least part of the carrier (see for instance FIG. 2). In this context, the term "annular section" may in particular cover any ring-shaped structure regardless of the shape of this ring. for instance, the annular section may be a rounded section such as a circular section or may have edges such as in case of a rectangular section. A through hole extending through the mechanically protective annular section of the molding structure may then provide direct access of the atmosphere surrounding the sensor arrangement to the active sensor component, thereby enabling accurate sensing.

Still referring to the previously described embodiment, one circumferential part of the annular section being free of wire bonds may have a smaller thickness in a lateral direction than another part of the annular section which encapsulates at least one wire bond for electrically contacting the carrier. Thus, the entire structure may be kept compact, since a small thickness of the molding structure may be sufficient at a portion thereof which does not have to accommodate wire bonds.

In another embodiment, a non-lateral protrusion of the molding structure protrudes beyond the carrier only along a part of a circumference of the carrier (see for instance FIG. 1). This protrusion may then accommodate and mechanically protect wire bonds.

Still referring to the previously described embodiment, one part of the molding structure being free of wire bonds substantially flushes with the active sensor component while the protrusion encapsulates at least one wire bond for electrically contacting the carrier. In other words, the one part being free of wire bonds may form a continuous surface together with the juxtaposed portion of the carrier.

In an embodiment, the sensor arrangement further comprises a further carrier and a further active sensor component mounted on a mounting surface of the further carrier and configured for providing a further sensor signal being indicative of another environmental property, wherein the molding structure encapsulates at least a part of an exterior surface of the further carrier. Such a sensor arrangement may comprise a further access recess exposing the further active sensor component with regard to the environment (see for instance FIG. 7). Alternatively, the access recess of such a sensor arrangement may expose also the further active sensor component with regard to the environment (see for instance FIG. 8). Thus, multiple carriers (such as multiple semiconductor chips) and multiple active sensor components (such as multiple sensor membranes of a pressure sensor) may be encapsulated within one and the same molding structure. This provides for a compact and powerful sensor arrangement. An asymmetric arrangement between a respective carrier and an assigned access recess may be realized for one or both carrier/access recess arrangements.

In an embodiment, the sensor arrangement further comprises a further active sensor component mounted on the mounting surface of the carrier and configured for providing a further sensor signal being indicative of a further environmental property, wherein the molding structure comprises a further access recess exposing the further active sensor component with regard to the environment, and wherein the further access recess is arranged asymmetrically with regard to the carrier (see for instance FIG. 9). Thus, multiple active sensor components (such as multiple sensor membranes of a pressure sensor) may be encapsulated within one and the same molding structure and may be mounted on one and the same carrier (for instance may be controlled by one and the same semiconductor chip). This provides for a compact and powerful sensor arrangement. An asymmetric arrangement between the carrier and an assigned access recess may be realized for the carrier in relation to one or both access recesses. It is also possible to provide only one common access recess exposing both active sensor components.

In an embodiment, the one or more carrier, the active sensor component and the further active sensor component form a differential pressure sensor. For instance, a pressure difference at the position of a first active sensor component and at the position of the second active sensor component may be measured with such an arrangement in a compact and precise way. The control of the active sensor components and/or processing of the sensor signals of the active sensor components may be performed by one common carrier or by two separate carriers.

In an embodiment, the carrier (and/or a further carrier, if present) is configured as an electronic chip (such as a semiconductor chip, for instance an application specific integrated circuit, ASIC) having at least one integrated circuit component. In such an embodiment, the active sensor component may be configured for supplying the sensor signal to the electronic chip for processing of the sensor signal by the at least one integrated circuit component. Thus, the carrier may be configured for sensor signal processing and/or sensor signal control. Alternatively, the carrier may only be a substrate or mounting base for the active sensor component with an electronic circuit realized therein, wherein the signal control unit and/or signal processing may then be performed elsewhere, i.e. by another electronic component arranged externally of the carrier.

In an embodiment, the active sensor component is mounted on a mounting surface of the carrier, in particular on a main surface of the carrier (see for instance FIG. 1, FIG. 2). In other words, the carrier may serve as mounting base on which the active sensor component, being a separate component, may be mounted.

In such an embodiment, the active sensor component may be a planar structure (such as a membrane) arranged in parallel to a main surface of a planar carrier constituting the mounting surface of the carrier (see for instance FIG. 1).

In another embodiment, the active sensor component is formed as part of the carrier, in particular at a lateral surface of the carrier and separated from a remainder of the carrier by a trench (see for instance FIG. 4, FIG. 6). Thus, it is also possible to form the carrier and the active sensor component from one single physical body, i.e. to integrate the active sensor component into the carrier. Particularly, a lateral edge part of the carrier may be processed by the formation of one or more trenches so as to form a sensor membrane being characteristically influenced by the ambient pressure. Alternatively, it is also possible to attach a separate active sensor component to a lateral side of a separate carrier.

In such an embodiment, the active sensor component may be a planar structure arranged perpendicular to a main surface of the carrier so that the active sensor component is arranged laterally at the carrier (see for instance FIG. 6).

In any of the previously described embodiments, a planar structure like a membrane (or a gas sensing structure) in combination with a surface portion of the carrier may form the actual sensor, for instance by measuring a change of the capacitance of this membrane/surface portion arrangement in response to a change of the environmental conditions. In another embodiment, the membrane alone may be the sensor, for instance if the membrane is made of a piezoelectric material which generates an electric signal in response to an environmental mechanical stimulus. In still a further embodiment, in which the membrane forms part of a microphone, a back volume may be formed by an indentation in a surface of the carrier over which the membrane is formed.

In an embodiment, the active sensor component comprises one of the group consisting of an acceleration sensor configured for detecting an acceleration (for instance in an airbag of a vehicle), a pressure sensitive component configured for sensing an environmental pressure (for instance for determining a height above sea level in a smart phone), a membrane component sensitive with regard to gas pressure of the environment (for instance for determining gas pressure in an industrial plant), a membrane component sensitive with regard to acoustic waves (for instance of a microphone), a chemical sensor (for instance for detecting the concentration of a chemical), and a gas sensor (for instance for detecting the concentration of a gas).

In an embodiment, the method comprises electrically contacting the carrier by electric connection structures, in particular by wire bonds, being attached to the carrier in an asymmetric pattern around the circumference thereof before forming the molding structure to completely encapsulate the wire bonds. Correspondingly, the sensor arrangement may comprise wire bonds (or other kinds of electric connection structures, for instance for realizing a flip-chip assembly) being attached to the carrier in an asymmetric pattern around the circumference of the carrier. Therefore, an unbalanced, non-uniform or irregular arrangement of the electric connection structures (for instance wire bonds) around the mounting surfaces of the carrier may allow to arrange the active sensor component in a region at the carrier which has a locally decreased amount of electric connection structures (for instance wire bonds) in its neighbourhood.

In an embodiment, the access recess is formed by inserting at least one insert into a volume later forming the access recess, and retracting the at least one insert out of the access recess after having formed the molding structure. For instance, the formation of the access recess may be performed by applying film-assisted molding or insert-molding. The insert may be moved out of the portion of the sensor arrangement forming its access recess after the formation of the molding structure.

In another embodiment, the access recess is formed by inserting at least one sacrificial structure into a volume later forming the access recess, and selectively eliminating the sacrificial structure after having formed the molding structure. Such a sacrificial structure may be a solid material which fills the access recess during formation of the molding structure. When this formation is finished, the sacrificial structure may be selectively removed, for instance by evaporating or etching it away, thereby forming the access recess.

In an embodiment, the method is configured so that the access recess is arranged with regard to the carrier in a way that a distance between the active sensor component and a wire bond contacting the carrier is more than a predefined threshold value. Only when this minimum target distance is achieved, the formed sensor arrangement is accepted, otherwise it is rejected.

In one embodiment, the carrier may be used as a support for active sensor components realized in microelectromechanical systems (MEMS) technology, for example as pressure sensors or acceleration sensors.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 7 shows a cross-sectional view of a sensor arrangement with two carriers encapsulated within a common molding structure having two separate access recesses according to another exemplary embodiment.

FIG. 8 shows a cross-sectional view of a sensor arrangement with two carriers encapsulated within a common molding structure having one common access recess exposing two active sensor components according to another exemplary embodiment.

FIG. 9 shows a cross-sectional view of a sensor arrangement with one carrier having two active sensor components and being encapsulated within one common molding structure having two separate access recesses according to another exemplary embodiment.

FIG. 10 shows a plan view of the sensor arrangement of FIG. 9.

FIG. 13 shows a cross-sectional view of a sensor arrangement with four carriers having four active sensor components and being encapsulated within a molding structure having four separate access recesses according to another exemplary embodiment.

FIG. 14 shows a plan view of the sensor arrangement of FIG. 13.

DETAILED DESCRIPTION OF EXEMPLARY EMBODIMENTS

Figure 1:
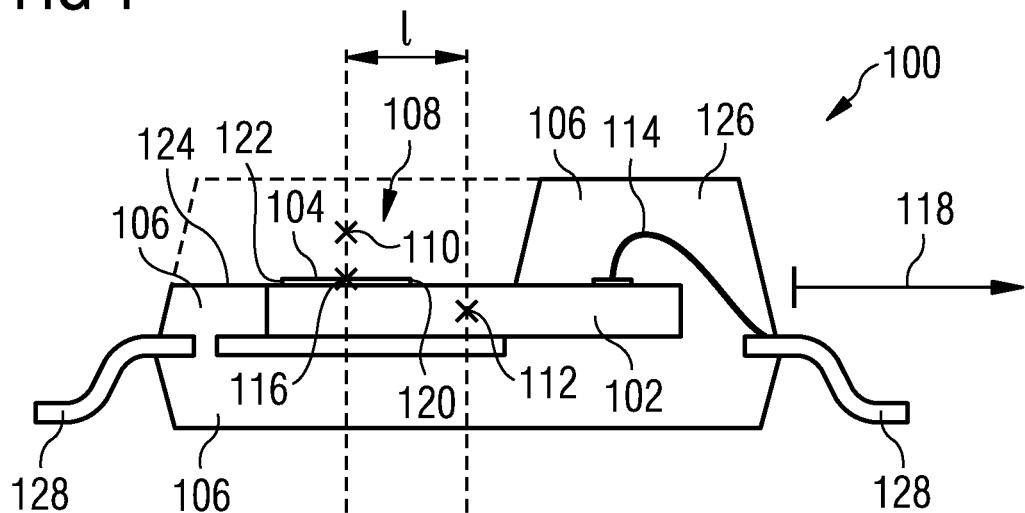
FIG. 1 shows a cross-sectional view of a sensor arrangement with an asymmetrically located access recess and an asymmetrically shaped molding structure according to an exemplary embodiment.

The illustration in the drawing is schematically and not to scale.

Before exemplary embodiments will be described in more detail referring to the figures, some general considerations will be summarized based on which exemplary embodiments have been developed.

Molded housings are a cost efficient, mechanically robust and spatially compact way of mounting active sensor components, such as pressure or gas sensors. An access recess, i.e. an opening for exposing the active sensor component of a sensor arrangement to the environment to be sensed, can be realized for instance by film-assisted molding.

In a conventional approach, an access recess or cavity is located centrically or symmetrically within the molding structure. This involves the limitation that relatively small carriers (such as relatively small electronic chips) cannot be used with such a centric or symmetric architecture, since this would result in a too small distance between active sensor component and bond pads. However, the use of small electronic chips is usually desired, since smaller chip areas result in smaller chip costs. Moreover, such a conventional approach only allows to use relatively large and expensive pre-molded housings.

According to an embodiment, the manufacture of a sensor housing with one or more cavities being arranged asymmetrically with regard to a carrier, i.e. in which the carrier is only partially overmolded, is considered particularly advantageous for carrier/molding structure geometries, which would otherwise be in the risk to contradict design rules of a housing technology in a symmetric arrangement. For instance, a too small distance between the active sensor component (such as a membrane of a pressure sensor) with regard to bond pads or wire pads can be forbidden by design rules. Compliance with such design rules may require to avoid the bond pads or wire pads to be too close to the surface of the molding structure. An asymmetric arrangement between access recess and carrier may be also advantageous for a carrier having an active sensor component which shall be located at an edge or a lateral end of the carrier rather than on a main surface thereof, conditioned by the sensor technology.

In contrast to the above mentioned conventional approaches, an exemplary embodiment manufactures a housing for a sensor arrangement with an access recess, wherein the latter is arranged in a non-symmetric way relatively to the overmolded carrier. Consequently, an active sensor component such as a membrane on the one hand and electric contract structures such as bond wires on the other hand, and also the access recess, can be spatially separated in a safe way so that the electric contact structures may be located with sufficient distance (for instance in accordance with design rules of a certain technology) with regard to a surface of the molding structure. Also a sufficient distance between the electric contact structures and the active sensor component may be ensured by such an asymmetric geometry. It has turned out advantageous that the center of gravity of the access recess is located above the center of gravity of the carrier in order to prevent an undesired tilting of the latter during the molding procedure.

A gist of an exemplary embodiment can be seen in that a sensor housing of a sensor arrangement is formed by molding after mounting and electrically contacting the sensor active component on the carrier, wherein an access recess in form of a cavity can be defined and kept free by an insert or the like in a molding tool during the molding procedure. By arranging the access recess or cavity asymmetrically with regard to the carrier (such as an electronic chip) so that the cavity extends laterally beyond the carrier allows to integrate smaller and therefore less expensive carriers within the molded structure and creates the freedom to implement specific sensor technologies using an edge or lateral end of a carrier to form the active sensor component. Therefore, an asymmetrical cavity assembly with an only partially molded carrier is provided.

FIG. 1 shows a cross-sectional view of a sensor arrangement 100 with an asymmetrically located access recess 108 according to an exemplary embodiment.

The sensor arrangement 100, here embodied as a pressure sensor, is configured for sensing an environmental pressure of an environment of the sensor arrangement 100 and comprises a carrier 102 which is here embodied as an electronic chip. The carrier 102 comprises integrated circuit components (such as transistors, diodes, inductances, capacitances, resistors, etc., not shown in the figure) configured for processing the sensor signal to thereby determine the environmental pressure value. The carrier 102 may have processing capabilities and/or storage capabilities.

The sensor arrangement 100 further comprises an active sensor component 104 in form of a sensor membrane which, together with the uppermost layer or portion of the carrier 102, provides an electronic sensor signal which is indicative of the present pressure value in the environment. In the shown embodiment, the active sensor component 104 is mounted on a mounting surface or upper main surface of the carrier 102. When a pressure is present in the environment, the membrane is moved or elongated and generates a corresponding sensor signal which can be supplied to the carrier 102 for processing. The processed sensor signal may then be passed from the carrier 102 to an electronic periphery for further processing or the like.

A molding structure 106 is provided for encapsulating part of the carrier 102 and comprises an access recess 108 at which no molding material is present and which exposes (and therefore fluidically couples) the active sensor component 104 to the environment.

As can be taken from FIG. 1, the access recess 108 is located at a lateral end portion of the molding structure 106 on the left-hand side of FIG. 1 and is therefore arranged asymmetrically with regard to the carrier 102 which is here located in a central portion of the sensor arrangement 100. As a consequence of the asymmetric arrangement, a center of gravity 110 of the access recess 108 is displaced by a distance "1" with regard to a center of gravity 112 of the carrier 102 in a lateral direction 118. Accordingly, a center of gravity 116 of the active sensor component 104 is displaced by the same distance "1" with regard to the center of gravity 112 of the carrier 102 in the lateral direction 118. The lateral direction 118 lies within the mounting surface plane of the carrier 102. The center of gravity 110 of the access recess 108 is in alignment and flushes with the center of gravity 116 of the active sensor component 104 in the lateral direction 118. The center of gravity 110 and the center of gravity 116 are only displaced relative to one another in a stacking direction, i.e. a vertical direction of FIG. 1, along which the carrier 102 and the active sensor component 104 are stacked on top of each other. The molding structure 106 is formed as an intrinsically asymmetric structure, i.e. has an asymmetric shape, and is also arranged asymmetrically with regard to the carrier 102.

The sensor arrangement 100 additionally comprises a plurality of wire bonds 114 (only one is visible in the cross-sectional view of FIG. 1) which are configured for electrically contacting the carrier 102 with regard to an electronic periphery and which are arranged exclusively at a lateral side 120 of the active sensor component 104 which faces the center of gravity 112 of the carrier 102, whereas another lateral side 122 of the active sensor component 104 which is averted with regard to the center of gravity 112 of the carrier 102 is free of wire bonds 114. The wire bonds 114 extend completely within the overmolded molding structure 106. The sensor arrangement 100 moreover comprises a plurality of electrically conductive pads 128 extending partially inside and partially outside of the molding structure 106. Each of the electrically conductive pads 128 is electrically connected to an assigned one of the at least one wire bond 114 to transmit electric signals between an electrical periphery of the sensor arrangement 100 and the carrier 102. Hence, the carrier 102 may deliver control signals via the electrically conductive pads 128 and the wire bonds 114 to the active sensor component 104, and may conduct electric sensor signals from the active sensor component 104 to the electronic periphery, for instance for further processing or display of the sensor results.

In view of the intrinsically asymmetric shape of the molding structure 106, a non-annular protrusion 126 of the molding structure 106 protrudes beyond the carrier 102 in a vertical direction according to FIG. 1, i.e. perpendicular to the lateral direction 118, and extends only along a sub-part of a circumference of the carrier 102. One part of the molding structure 106 shown on the left hand side of FIG. 1, being denoted with reference numeral 124 is free of wire bonds 114 and flushes stepless with the active sensor component 104 and the carrier 102. The protrusion 126 encapsulates all wire bonds 114 for electrically contacting the carrier 102.

In comparison to a symmetric arrangement of the access recess 108 with regard to the carrier 102, the asymmetric arrangement according to FIG. 1 allows to keep the distance between the lateral side 120 of the active sensor component 104 and the wire bond 114 sufficiently large to avoid undesired interaction between the active sensor component 104 and electric signals propagating along the wire bonds 114. This allows to manufacture the sensor arrangement 100 in accordance with design rules of many technologies and also allows to implement small-sized carriers 102. Hence, the sensor arrangement 100 can be scaled to small dimensions thanks to the asymmetric configuration.

These advantages can be obtained by moving the active sensor area (defined by active sensor component 104) out of the die center (i.e. away from a central position of the carrier 102) and by a rearrangement of the wire bonds 114 in a way that they are located remotely from the active sensor arrangement 104.

As can be taken from FIG. 1, in comparison to a symmetric arrangement of the active sensor component 104 at a central position of the mounting surface of the carrier 102 and in comparison to a symmetric distribution of wire bonds 114 around a circumference of the carrier 102, the active sensor component 104 is shifted outwardly on the mounting surface along a shifting direction (according to FIG. 1 towards the left-hand side) and the distribution of wire bonds 114 is concentrated around a part of the circumference of the carrier 102 so as to be displaced opposing to the shifting direction.

Figure 2:
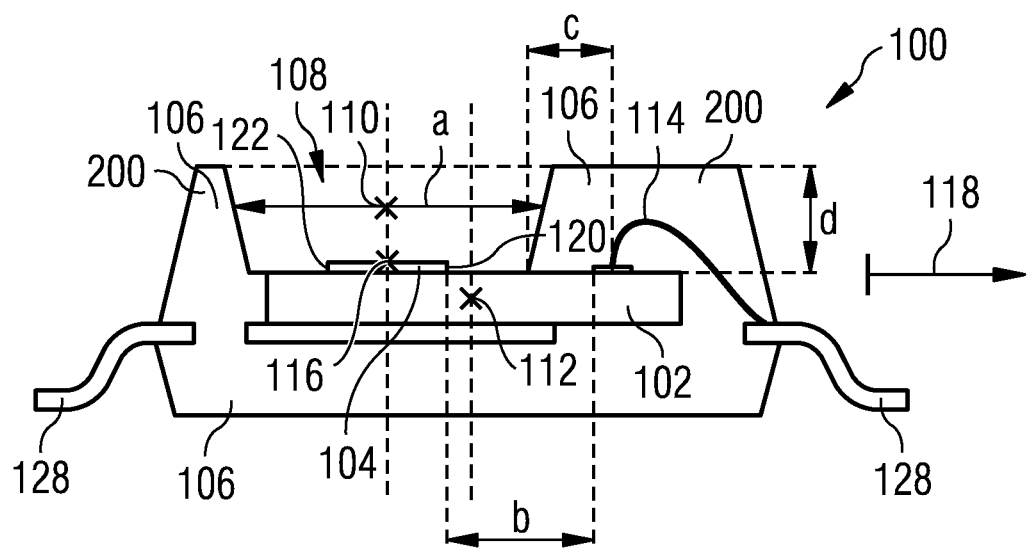
FIG. 2 shows a cross-sectional view of a sensor arrangement with an asymmetrically located access recess delimited by an asymmetrically shaped molding structure according to another exemplary embodiment.

FIG. 2 shows a cross-sectional view of a sensor arrangement 100 with an asymmetrically located access recess 108 according to another exemplary embodiment.

In the embodiment of FIG. 2, the molding structure 106 comprises an annular section 200 which circumferentially surrounds the active sensor component 104 and a part of the carrier 102. A part of the annular section 200 shown on the left-hand side of FIG. 2 is free of wire bonds 114 and has a smaller thickness in the lateral direction 118 than another part of the annular section 200, shown on the right-hand side of FIG. 2, which encapsulates the wire bonds 114 for electrically contacting the carrier 102. By taking this measure, the weight and dimensions of the sensor arrangement 100 can be kept small while properly protecting the sensitive active sensor component 104 and the wire bonds 114 against damage.

Referring to FIG. 2, it will be described in the following that the asymmetric arrangement of the access recess 108 with regard to the carrier 102 allows to achieve compliance with design rules of the corresponding technology and allows to implement small carriers 102. FIG. 2 shows some characteristic dimensions of the sensor arrangement 100, i.e. a lateral width "a" of the access recess 108, a lateral distance "b" between the lateral edge 120 on the right hand side of the active sensor component 104 and a bonding pad assigned to the wire bond 114, a lateral distance "c" between the right end of the access recess 108 and the wire bond 114, as well as a depth "d" of the access recess 108. For the shown technology, a given design rule limit may be that the distance of the cavity or access recess 108 to the critical area, for instance the wire bond 114 (c or b) should be sufficiently large. Another design rule can be that the aspect ratio, i.e. the ratio a/d, should be sufficiently large. With a symmetric arrangement of the access recess 108 with regard to the carrier 102, the mentioned design rules are difficult if not impossible to comply with, particularly when the dimensions of the carrier 102 become smaller and smaller. For a small die as carrier 102 (as required for pressure sensors, for example), a symmetric geometry is hence not appropriate, because the distances c, b become too small and the aspect ratio a/d becomes too small as well. As can be taken from FIG. 2, the values of parameters a, b, c can be designed to be sufficiently large with an asymmetric arrangement of the access recess 108 relative to the carrier 102, with an as symmetric arrangement of the active sensor component 104 relative to the carrier 102, and with an intrinsically asymmetric arrangement of the molding structure 106. In other words, the exemplary embodiment of FIG. 2 moves the active area in form of the active sensor component 104 out of the center of the carrier 102 and rearranges the bond pads 114 in a way, that a higher ratio a/d and larger values b or c can be achieved in the mold process.

Figure 3:
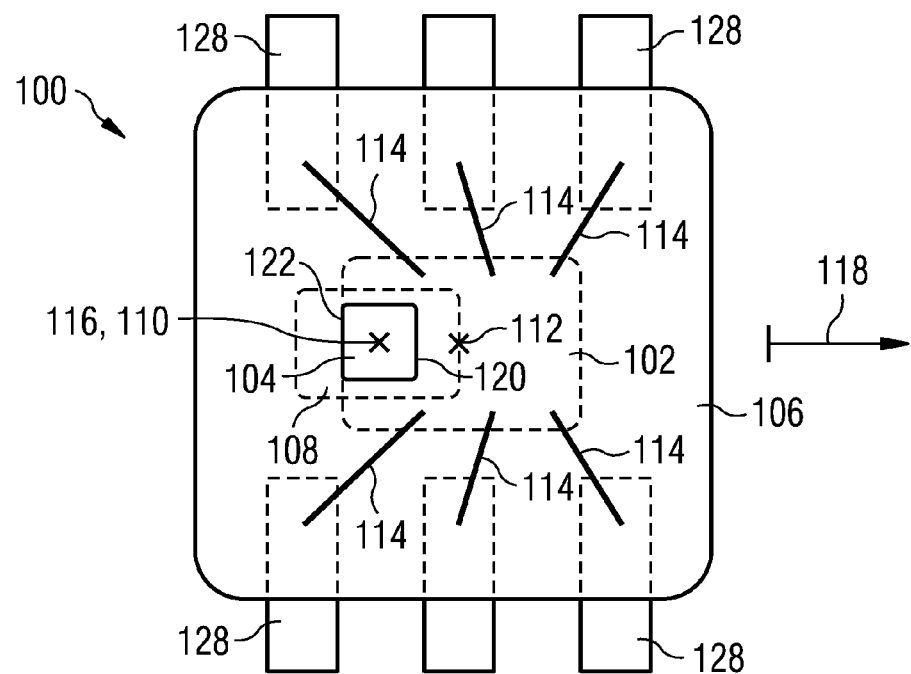
FIG. 3 shows a plan view of the sensor arrangement of FIG. 2.

FIG. 3 shows a plan view of the sensor arrangement 100 of FIG. 2.

Particularly, FIG. 3 shows that the asymmetric interior configuration of the sensor arrangement 100, compare particularly the asymmetric arrangement of the wire bonds 114 distributed exclusively along about half the perimeter of the carrier 102, does not result in an exterior asymmetry of the sensor arrangement 100, since the electrically conductive pads 128 are nevertheless distributed equally along two opposing sides of the sensor arrangement 100. Hence, the asymmetric interior configuration of the sensor arrangement 100 does not result in any exterior limitation concerning the electrical contacting of the sensor arrangement 100 to the electronic periphery. According to FIG. 3, the wire bonds 114 attached to the carrier 102 form an asymmetric pattern around the circumference of the carrier 102.

Figure 4:
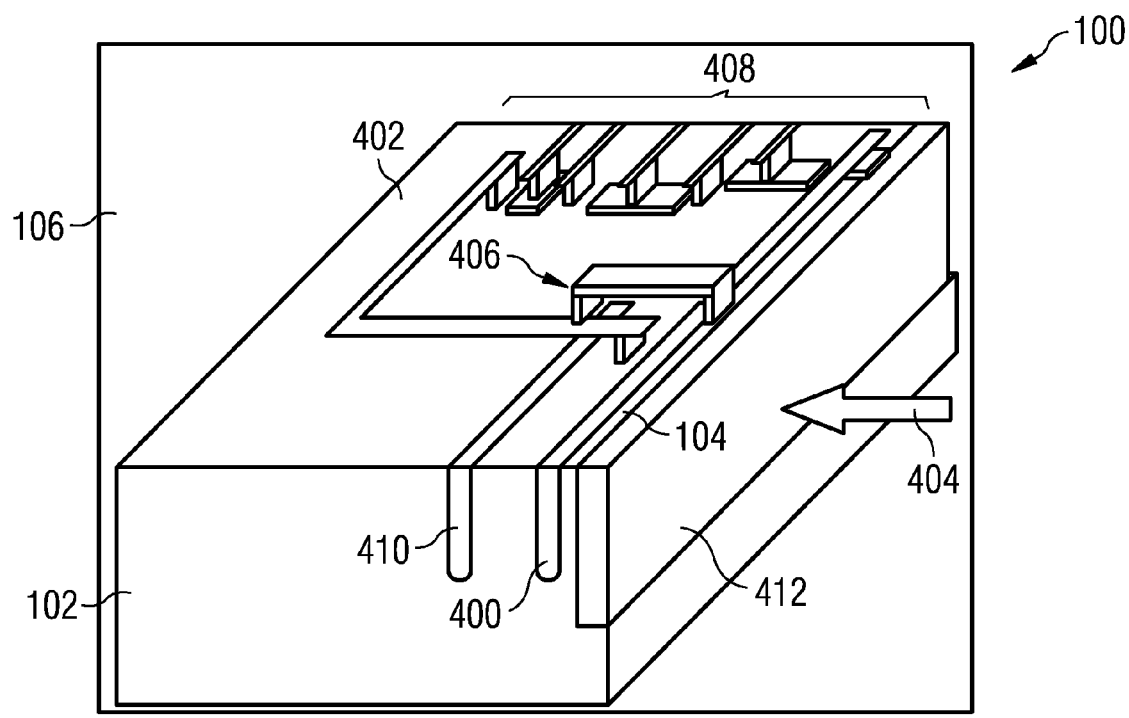
FIG. 4 shows a three-dimensional view of a sensor arrangement according to another exemplary embodiment having an active sensor component arranged at a lateral edge of a carrier and integrally formed therewith.

FIG. 4 shows a three-dimensional view of a sensor arrangement 100 according to another exemplary embodiment having an active sensor component 104 arranged at a lateral edge of a carrier 102.

More precisely, the active sensor component 104 is configured to form part of the carrier 102 in the embodiment of FIG. 4. The active sensor component 104 is arranged as a pressure blade or pressure fin at a lateral surface of the carrier 102 and is separated from a remainder of the carrier 102 by a vertical trench 400 (an optional further trench 410 is shown in FIG. 4 as well). Reference numeral 412 indicates a chip side after stealth dicing. Hence, the active sensor component 104 is not mounted on a main surface 402 of the carrier 102 in the embodiment of FIG. 4, but is in contrast to this integrally formed with the carrier 102 by simply removing material of the carrier 102, for example by etching or the like, at the position of the trench 400. When pressure is applied to the sensor arrangement 100 according to FIG. 4, as indicated schematically by reference numeral 404, the membrane-like active sensor component 104 is displaced and thereby generates an electric sensor signal at a connected measurement bridge 406. An ASIC of the carrier 102 which is driven by a drive entity 408 may then process the electric sensor signal, for instance to determine the actual pressure value causing the membrane to move. Thus, the embodiment of FIG. 4 uses a side wall of the carrier 102 as sensor membrane.

Figure 5:
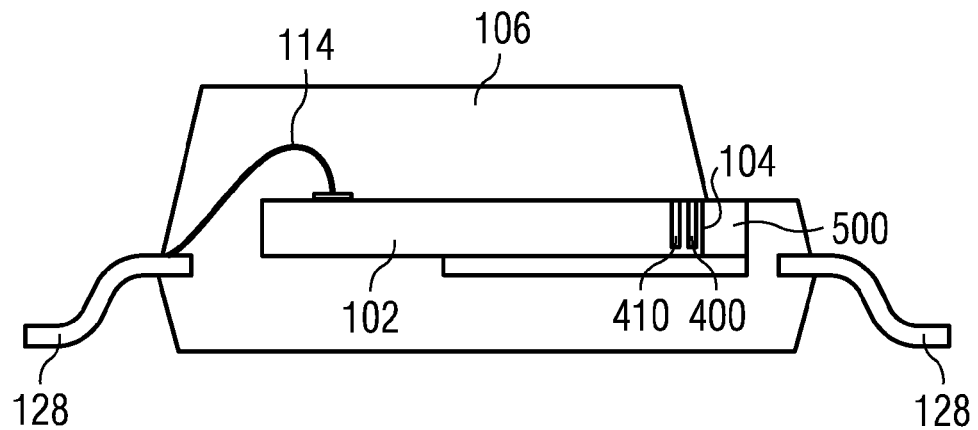
FIG. 5 shows a cross-sectional view of a structure obtained during carrying out a method of manufacturing the sensor arrangement shown in FIG. 4 according to an exemplary embodiment.
Figure 6:
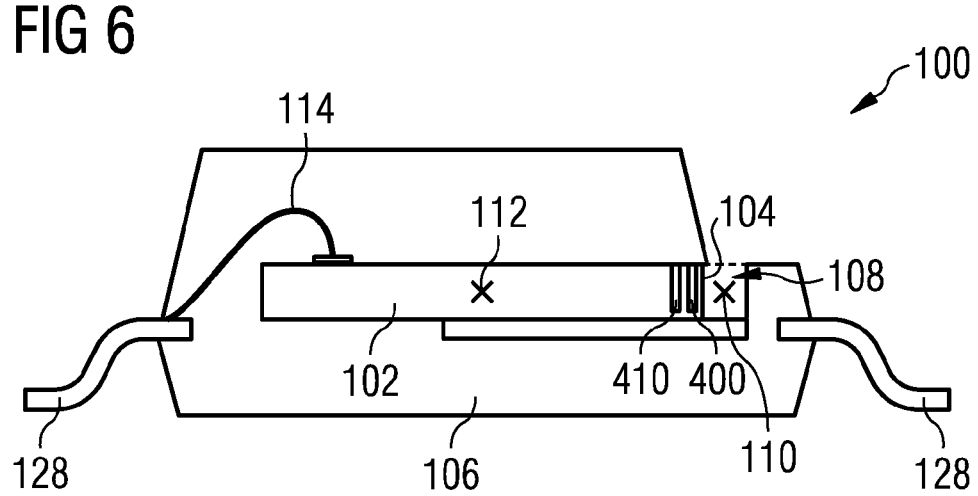
FIG. 6 shows a cross-sectional view of the sensor arrangement according to FIG. 4 and manufactured in accordance with FIG. 5.

FIG. 5 shows a cross-sectional view of a structure obtained during carrying out a method of manufacturing the sensor arrangement 100 shown in FIG. 4 according to an exemplary embodiment. FIG. 6 shows a cross-sectional view of the sensor arrangement 100 according to FIG. 4 and manufactured in accordance with FIG. 5.

As can be taken from FIG. 5 and FIG. 6, the access recess 108 (required for exposing the active sensor component 104 to the environment for being sensitive to the ambient pressure) can be formed by inserting sacrificial material 500 (such as a material being etchable with a high selectively to the surrounding matter and with a high etch rate) into a volume later forming the access recess 108, and selectively eliminating the sacrificial material 500 (for instance by applying a selective etching procedure to evaporate the sacrificial material 500, while not attacking the remaining material of the sensor arrangement 100) after having formed the molding structure 106. As an alternative to such an etching procedure, it is also possible to temporarily place an insert into the volume of the later formed access recess 108 during the molding procedure and to remove the insert after the molding procedure, thereby forming the access recess 108 (for instance by film-assisted molding or insert molding).

FIG. 7 shows a cross-sectional view of a sensor arrangement 100 with two carriers 102, 700 encapsulated within the same molding structure 106 having two separate access recesses 108, 704 according to another exemplary embodiment. Carrier 700 is also equipped with an active sensor component 702 such as a sensor membrane. The asymmetry between the access recess 108 and the carrier 102 is repeated accordingly in relation between the access recess 704 and the carrier 700. All wire bonds 114 are formed in a central protrusion 710 of the molding structure 106, whereas the active sensor components 104, 702 are both shifted outwardly so as to be sufficiently spaced with regard to the wire bonds 114. Thus, a dual die package can be realized with the architecture according to FIG. 7, for instance to provide two sensors.

FIG. 8 shows a cross-sectional view of a sensor arrangement 100 with two carriers 102 both encapsulated only partially within the same molding structure 106 having one common access recess 108 according to another exemplary embodiment. The main difference between the embodiment of FIG. 8 and the embodiment of FIG. 7 is that the central protrusion 710 is omitted according to FIG. 8. Correspondingly, all wire bonds 114 are shifted outwardly according to FIG. 8, whereas both active sensor components 104, 702 are shifted inwardly, to achieve compliance with design rules by spacing the active sensor components 104, 702 sufficiently with regard to the wire bonds 114.

FIG. 9 shows a cross-sectional view of a sensor arrangement 100 with one carrier 102 carrying two active sensor components 104, 702 and being encapsulated within a molding structure 106 having two separate access recesses 108, 704 according to another exemplary embodiment. FIG. 10 shows a plan view of the sensor arrangement 100 of FIG. 9.

The main difference between the embodiment of FIG. 9 and the embodiment of FIG. 7 is that only a single carrier 102 needs to be provided for serving both active sensor components 104, 702 according to FIG. 9. One application of the embodiment of FIG. 9 is a differential pressure sensor capable of measuring a pressure difference between the position of the active sensor component 104 and the active sensor component 702.

Figure 11:
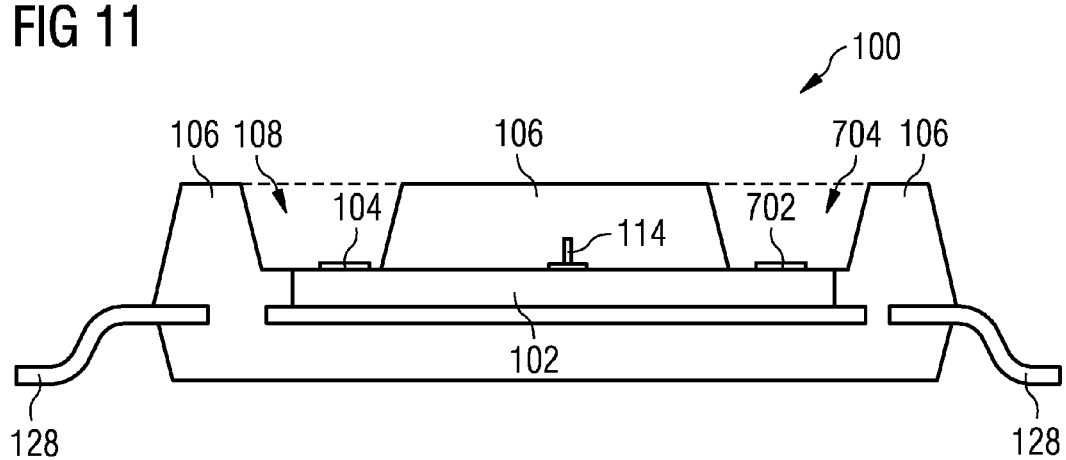
FIG. 11 shows a cross-sectional view of a sensor arrangement with one carrier having four active sensor components and being encapsulated within a molding structure having four separate access recesses according to another exemplary embodiment.
Figure 12:
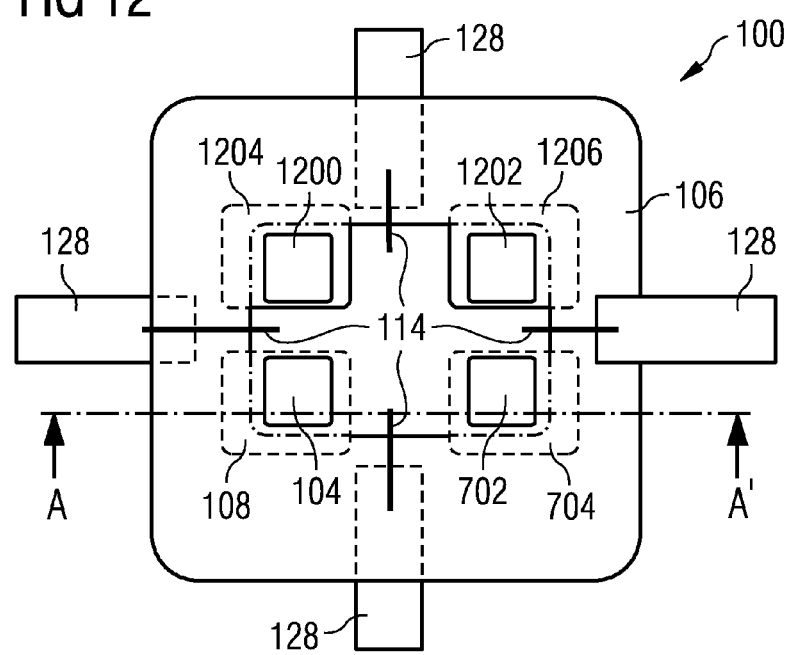
FIG. 12 shows a plan view of the sensor arrangement of FIG. 11.

FIG. 11 shows a cross-sectional view and FIG. 12 shows a plan view of a sensor arrangement 100 with one carrier 102 having four active sensor components 104, 702, 1200, 1202 and being encapsulated within a molding structure 106 having four separate access recesses 108, 704, 1204, 1206 according to another exemplary embodiment. The cross-section according to FIG. 11 is taken along a line A-A' shown in FIG. 12.

The embodiment of FIG. 11 is similar to the embodiment of FIG. 9, but involves active sensor components 104, 702, 1200, 1202 and access recesses 108, 704, 1204, 1206 arranged in rows and columns, i.e. in a matrix like pattern. Any other number of active sensor components and/or access recesses is possible.

FIG. 13 shows a cross-sectional view and FIG. 14 shows a plan view of a sensor arrangement 100 with four carriers 102, 700, 1400, 1402, with four active sensor components 104, 702, 1200, 1202 and being encapsulated within a molding structure 106 having four separate access recesses 108, 704, 1204, 1206 according to another exemplary embodiment. The cross-section according to FIG. 13 is taken along a line B-B' shown in FIG. 14.

The embodiment of FIG. 13 and FIG. 14 is similar to the embodiment of FIG. 9, but involves multiple carriers 102, 700, 1400, 1402 arranged in rows and columns, i.e. in a matrix like pattern. Any other number of active sensor components and/or access recesses is possible.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A sensor arrangement for sensing an environmental property of an environment of the sensor arrangement, the sensor arrangement comprising:
    a carrier;
    an active sensor component arranged at the carrier and configured for providing a sensor signal being indicative of the environmental property;
    a molding structure encapsulating at least a part of an exterior surface of the carrier and comprising an access recess exposing the active sensor component with regard to the environment;
    wherein the access recess is arranged asymmetrically with regard to the carrier;
    wherein one part of the molding structure being free of wire bonds substantially flushes with the active sensor component; and
    wherein the one part of the molding structure forms a continuous surface together with a juxtaposed portion of the carrier; and
    wherein the molding structure comprises an annular section which circumferentially surrounds the active sensor component and the continuous surface.

2. The sensor arrangement according to claim 1, wherein a center of gravity of the access recess is displaced with regard to a center of gravity of the carrier in a lateral direction.

3. The sensor arrangement according to claim 1, wherein a center of gravity of the active sensor component is displaced with regard to a center of gravity of the carrier in a lateral direction.

4. The sensor arrangement according to claim 1, comprising at least one electric connection structure configured for electrically contacting the carrier and being arranged exclusively at a side of the active sensor component which faces a center of gravity of the carrier, whereas another side of the active sensor component which is averted with regard to the center of gravity of the carrier is free of electric connection structures.

5. The sensor arrangement according to claim 1, comprising at least one wire bond configured for electrically contacting the carrier and being arranged exclusively at a lateral side of the active sensor component which faces a center of gravity of the carrier, whereas another lateral side of the active sensor component which is averted with regard to the center of gravity of the carrier is free of wire bonds.

6. The sensor arrangement according to claim 5, comprising at least one electrically conductive pad extending partially inside and partially outside of the molding structure, wherein each of the at least one electrically conductive pad is electrically connected to an assigned one of the at least one wire bond.

7. The sensor arrangement according to claim 1, wherein one part of the annular section being free of wire bonds has a smaller thickness in a lateral direction than another part of the annular section which encapsulates at least one wire bond for electrically contacting the carrier.

8. The sensor arrangement according to claim 1, wherein a protrusion of the molding structure protrudes beyond the carrier only along a part of a circumference of the carrier.

9. The sensor arrangement according to claim 8, wherein one part of the molding structure being free of wire bonds substantially flushes with the active sensor component while the protrusion encapsulates at least one wire bond for electrically contacting the carrier.

10. The sensor arrangement according to claim 1,
further comprising a further carrier and a further active sensor component mounted on the further carrier and configured for providing a further sensor signal being indicative of another environmental property;
wherein the molding structure encapsulates at least a part of an exterior surface of the further carrier and the further active sensor component is exposed with regard to the environment.

11. The sensor arrangement according to claim 1,
further comprising a further active sensor component mounted on the carrier and configured for providing a further sensor signal being indicative of a further environmental property;
wherein the molding structure comprises a further access recess exposing the further active sensor component with regard to the environment;
wherein the further access recess is arranged asymmetrically with regard to the carrier.

12. The sensor arrangement according to claim 1, wherein the molding structure has an asymmetric shape.

13. The sensor arrangement according to claim 1, wherein the active sensor component is mounted on a mounting surface of the carrier, in particular on a main surface of the carrier.

14. The sensor arrangement according to claim 1, wherein the active sensor component is formed as part of the carrier, in particular at a lateral surface of the carrier and separated from a rest of the carrier by at least one trench.

15. A method of manufacturing a sensor arrangement for sensing an environmental property of an environment of the sensor arrangement, the method comprising:
arranging an active sensor component at a carrier;
configuring the active sensor component for providing a sensor signal being indicative of the environmental property when the sensor arrangement is in operation;
forming a molding structure to encapsulate at least a part of an exterior surface of the carrier and to comprise an access recess exposing the active sensor component with regard to the environment so that the access recess is arranged asymmetrically with regard to the carrier;
wherein one part of the molding structure being free of wire bonds substantially flushes with the active sensor component; and
wherein the one part of the molding structure forms a continuous surface together with a juxtaposed portion of the carrier; and
wherein the molding structure comprises an annular section which circumferentially surrounds the active sensor component and the continuous surface.

16. The method according to claim 15, wherein the method comprises electrically contacting the carrier by electric connection structures, in particular by wire bonds, being attached to the carrier in an asymmetric pattern around only part of the circumference thereof before forming the molding structure to completely encapsulate the wire bonds.

17. The method according to claim 15, wherein the method comprises forming the access recess by temporarily inserting at least one insert into a volume later forming the access recess, and retracting the at least one insert out of the access recess after having formed the molding structure.

18. The method according to claim 15, wherein the method comprises forming the access recess by forming at least one sacrificial structure within a volume later forming the access recess, and selectively eliminating the sacrificial structure after having formed the molding structure.

19. The method according to claim 15, wherein the method comprises arranging the access recess with regard to the carrier so that a distance between the active sensor component and at least one wire bond contacting the carrier is more than a predefined threshold value.

* * * * *